(12) United States Patent
Hareland et al.

(10) Patent No.: US 6,887,395 B2
(45) Date of Patent: May 3, 2005

(54) METHOD OF FORMING SUB-MICRON-SIZE STRUCTURES OVER A SUBSTRATE

(75) Inventors: Scott A. Hareland, Tigard, OR (US);
Brian S. Doyle, Portland, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 187 days.

(21) Appl. No.: 10/364,281

(22) Filed: Feb. 10, 2003

(65) Prior Publication Data

US 2004/0155011 A1 Aug. 12, 2004

(51) Int. Cl.[7] .............................................. H01L 21/00
(52) U.S. Cl. .............................. 216/46; 216/2; 216/41; 438/696; 438/947
(58) Field of Search .............................. 216/2, 41, 46; 438/696, 947

(56) References Cited

U.S. PATENT DOCUMENTS

| | | | | |
|---|---|---|---|---|
| 4,499,119 A | * | 2/1985 | Smith | 427/63 |
| 4,536,951 A | * | 8/1985 | Rhodes et al. | 438/623 |
| 4,849,369 A | * | 7/1989 | Jeuch et al. | 438/257 |
| 6,225,201 B1 | * | 5/2001 | Gardner et al. | 438/585 |
| 6,664,173 B2 | * | 12/2003 | Doyle et al. | 438/587 |
| 2003/0235948 A1 | * | 12/2003 | Park | 438/253 |

\* cited by examiner

*Primary Examiner*—Allan Olsen
(74) *Attorney, Agent, or Firm*—Blakely, Sokoloff, Taylor & Zafman LLP

(57) ABSTRACT

A method is provided for forming sub-micron-size structures over a substrate. A width-defining step is formed over the substrate. A width-defining layer is formed over an edge of the width-defining step. The width-defining layer is etched back to leave a spacer adjacent the width-defining step. A length-defining step is formed over the substrate. A length-defining layer is formed over an edge of the length-defining step. The length-defining layer is etched back to leave a spacer adjacent a first edge of the length-defining step and across a first portion of the spacer left by the width-defining layer. The length-defining step is then removed. The spacer left by the width-defining layer is then etched with the spacer left by the length-defining layer serving as a mask, to form the structure.

16 Claims, 4 Drawing Sheets

METHOD OF FORMING SUB-MICRON-SIZE STRUCTURES OVER A SUBSTRATE

BACKGROUND OF THE INVENTION

1). Field of the Invention

This invention relates to a method of forming sub-micron-size structures over a substrate.

2). Discussion of Related Art

Nanotechnology involves the formation of extremely small structures with dimensions on the order of nanometers in multiple directions. What may often be required is to form multiple structures across the width and/or length of a substrate, wherein each structure has a very small and accurate width as well as a very small and accurate length.

Laboratory techniques are often used for selective deposition of materials using atomic force microscopy (AFM) or scanning tunneling microscopes (STM). While these techniques can successfully form such small structures, large-scale integration is not possible.

As an alternative, nanowire or nanotube growth techniques may be used, but such techniques may rely on small nanometer-size nucleation sites which facilitate the growth of nanowires. Such nucleation sites are typically randomly deposited on a substrate. While structures can be created, there are problems related to the selective growth of these nanowires or nanotubes in specific locations on a substrate due to a lack of patterning and placement capabilities of the nucleation sites.

BRIEF DESCRIPTION OF THE DRAWINGS

The invention is described by way of example with reference to the accompanying drawings, wherein.

DETAILED DESCRIPTION OF THE INVENTION

A method is provided for forming sub-micron-size structures over a substrate. A width-defining step is formed over the substrate. A width-defining layer is formed over an edge of the width-defining step. The width-defining layer is etched back to leave a spacer adjacent the width-defining step. A length-defining step is formed over the substrate. A length-defining layer is formed over an edge of the length-defining step. The length-defining layer is etched back to leave a spacer adjacent a first edge of the length-defining step and across a first portion of the spacer left by the width-defining layer. The length-defining step is then removed. The spacer left by the width-defining layer is then etched with the spacer left by the length-defining layer serving as a mask, to form the structure.

Figure 1:
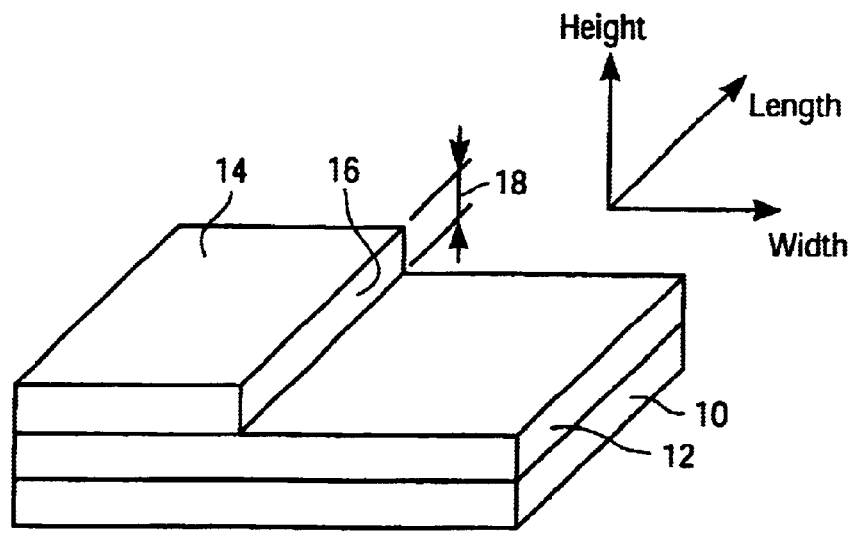
FIG. 1 is a perspective view of a substrate having an insulating layer and a patterned width-defining step formed thereon.

FIG. 1 illustrates initial processing for forming structures according to an embodiment of the invention. A substrate 10 is provided and an insulating layer 12 is formed on the substrate 10. A patterning layer is then formed on the insulating layer 12, and patterned into a width-defining step 14. The patterning layer may, for example, be silicon nitride ($Si_3N_4$). The width-defining step 14 is formed partially over the insulating layer 12 while leaving a portion of the insulating layer 12 exposed. The width-defining step 14 has a longitudinal edge 16 extending across a length of the insulating layer 12. The edge 16 has a height 18 which is determined by the thickness of the original patterning layer out of which the width-defining step 14 is formed. The height 18 is typically on the order of several nanometers, certainly less than one micron.

Figure 2:
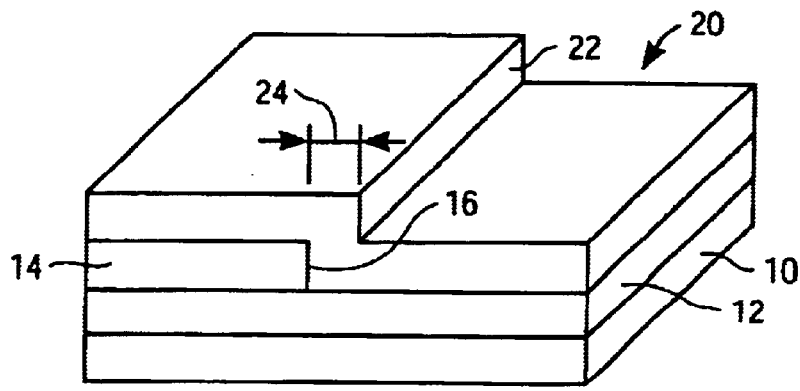
FIG. 2 is a view similar to FIG. 1 after a width-defining layer is formed.

Next, as illustrated in FIG. 2, a width-defining layer 20 is formed. The width-defining layer 20 is conformally formed over an upper surface of the width-defining step 14, the edge 16 thereof, and over an upper surface of the insulating layer 12. The width-defining layer 20 may be made of a nucleation material such as gold or a material such as silicon or gallium arsenide used for forming quantum dots. Various materials may be used for forming the width-defining layer 20. Because the width-defining layer 20 is conformally deposited, it has an edge 22 which is horizontally spaced from the edge 16 by a width 24. The width 24, as with the height 18, is typically on the order of a few nanometers, and certainly less than one micron. As will be discussed hereinafter, the width-defining layer 20 in the present embodiment also serves as the layer from which final sub-micron-size structures are formed.

Figure 3:
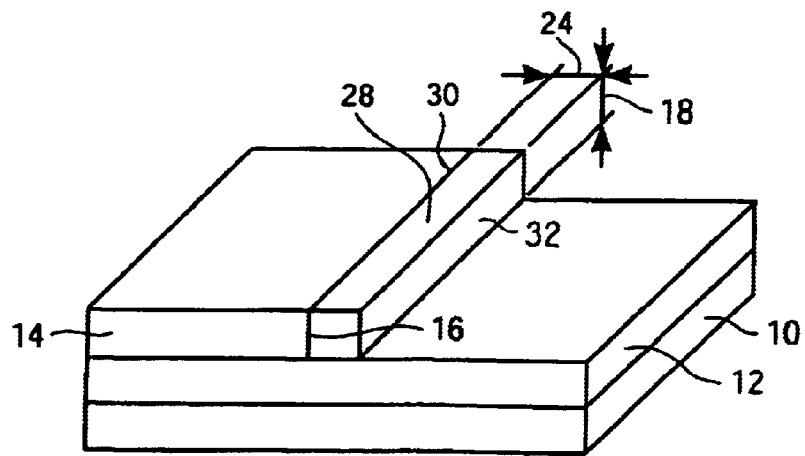
FIG. 3 is a view similar to FIG. 2 after the width-defining layer is etched back to leave a spacer adjacent the width-defining step.

As illustrated in FIG. 3, the width-defining layer 20 is subsequently anisotropically etched back until the upper surfaces of the width-defining step 14 and the insulating layer 12 are exposed. An etchant is used that selectively removes the material of the width-defining layer 20 over the materials of the width-defining step 14 and the insulating layer 12.

The only portion of the width-defining layer 20 that remains is a spacer 28. The spacer 28 has the same width 24 between left and right edges 30 and 32 thereof. The left edge 30 is located adjacent the edge 16 of the width-defining step 14, and the right edge 32 is located distant from the edge 16. The spacer 28 has a vertical height which corresponds approximately to the vertical height 18 of the width-defining step 14, and may also be modulated by the amount of controlled overetch applied. Because of the process used for forming the spacer 28, the spacer 28 has a width 24 which is extremely narrow, yet extremely uniform.

Figure 4:
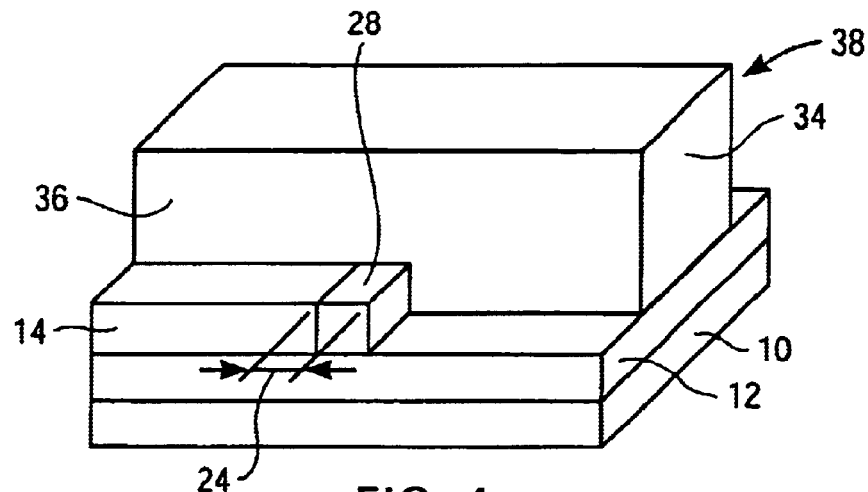
FIG. 4 is a view similar to FIG. 3 after a length-defining step is formed.

Subsequently, as illustrated in FIG. 4, a length-defining step 34 is formed. The length-defining step 34 is typically formed out of a silicon dioxide layer (SiO$_2$) that is patterned to have front and rear transverse edges 36 and 38, respectively. The edge 36 extends across a width of the width-defining step 14, the width 24 of the spacer 28, and a width of the insulating layer 12. The edge 38 also extends across the width of the width-defining step 14, the width 24 of the spacer 28, and the width of the insulating layer 12, but is spaced from the edge 36 along the length of the spacer 28.

Figure 5:
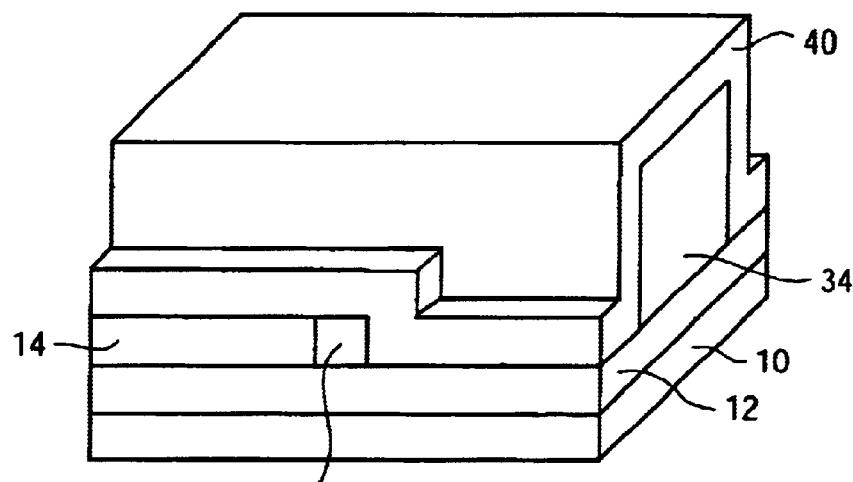
FIG. 5 is a view similar to FIG. 4 after a length-defining layer is formed.

Next, as illustrated in FIG. 5, a length-defining layer 40 is conformally deposited over the structures illustrated in FIG. 4. The length-defining layer 40 is made of a different material than the spacer 28 and may, for example, be made of silicon nitride. The length-defining layer 40 has a larger vertical height directly adjacent the length-defining step 34 and distant or on top thereof. The length-defining layer 40 may, for example, be made of silicon nitride.

Figure 6:
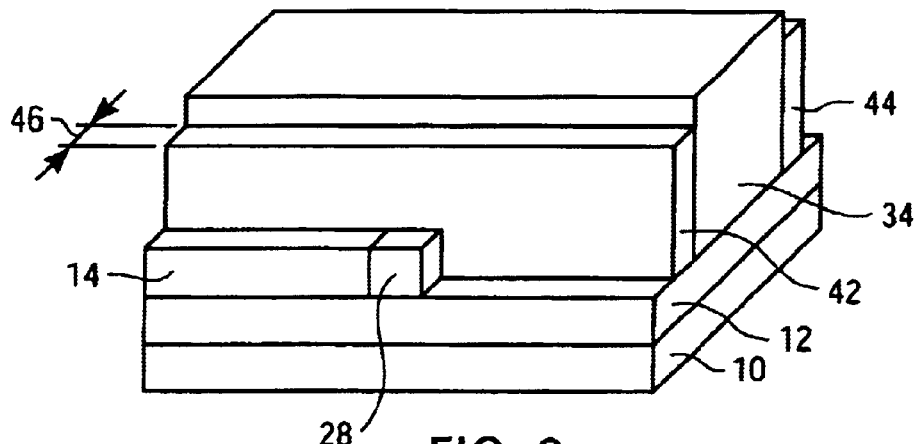
FIG. 6 is a view similar to FIG. 5 after the length-defining layer is etched back to leave length-defining spacers.

As illustrated in FIG. 6, the length-defining layer 40 is subsequently etched back to expose an upper portion of the length-defining step 34 and surfaces of the spacer 28. An etchant is used which selectively removes the material of the length-defining layer 40 over the materials of the length-defining step 34, width-defining step 14, spacer 28, and insulating layer 12. The length-defining layer 40 is anisotropically etched so that first and second spacers 42 and 44 thereof remain adjacent the length-defining step 34 and, due to the larger vertical height of the length-defining layer 40, adjacent the length-defining step 34. Each spacer 42 or 44 has a thickness 46 as measured in a direction of the length of the spacer 28.

Figure 7:
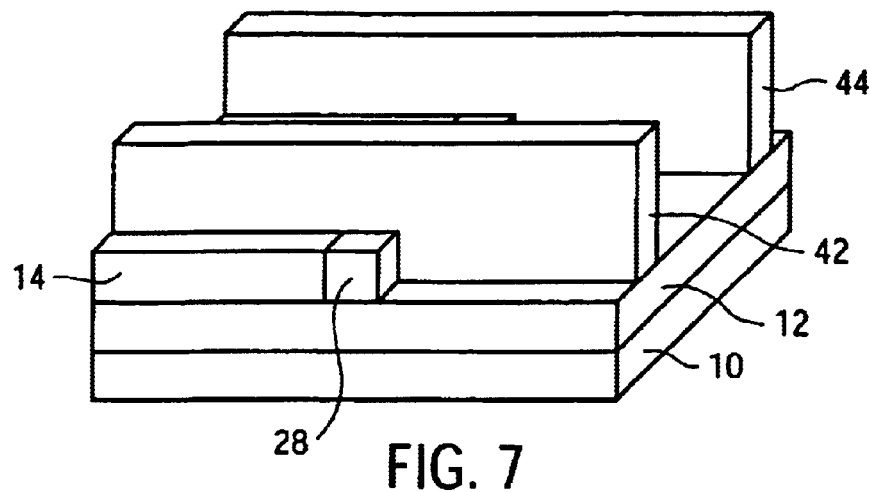
FIG. 7 is a view similar to FIG. 6 after the length-defining step is removed.

As further illustrated in FIG. 7, the length-defining step 34 is subsequently removed. An etchant is used that selectively removes the material of the length-defining step 34 over the materials of the spacers 42 and 44, the spacer 28, the width-defining step 14, and the insulating layer 12. Each spacer 42 or 44 is now located over a portion of an upper surface and a portion of a right edge of the spacer 28, and other portions of the upper surface and side surface of the spacer 28 are exposed. Because of the technique used for forming the spacers 42 and 44, they are extremely thin and also extremely uniform in thickness.

Figure 8:
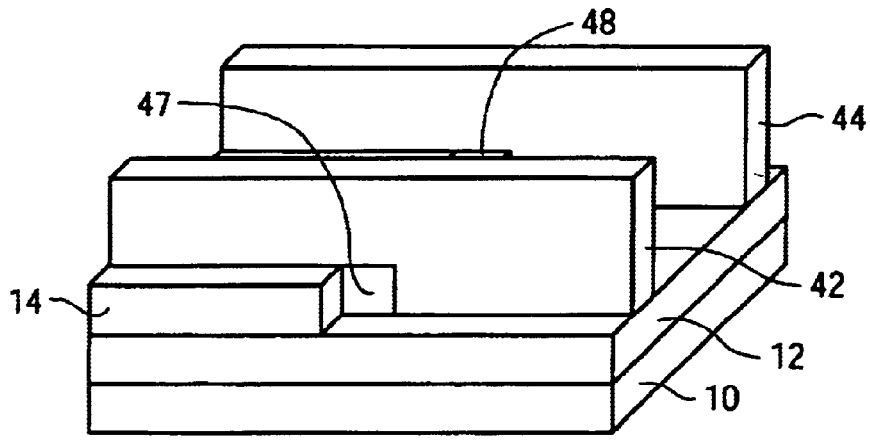
FIG. 8 is a view similar to FIG. 7 after the spacers left by the length-defining layer are used as a mask to etch the spacer left by the width-defining layer.

Next, as illustrated in FIG. 8, exposed portions of the spacer 28 are removed with an etchant that selectively removes the material of the spacer 28 over the materials of the other components illustrated in FIG. 8. The spacers 42 and 44 serve as a mask, and what remains of the original spacer 28 are structures 47 and 48 located directly below the spacers 42 and 44. The structure 47 has a length corresponding to the thickness of the spacer 42, and the structure 48 has a length corresponding to the thickness of the spacer 44.

Figure 9:
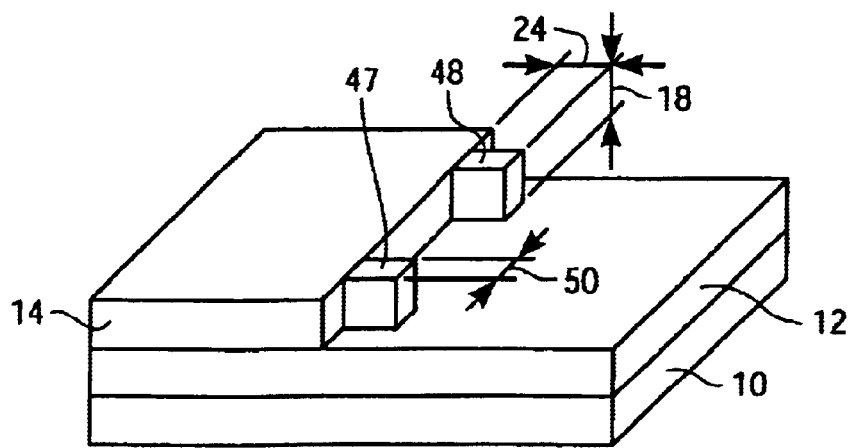
FIG. 9 is a view similar to FIG. 8 after the spacers left by the length-defining layer are removed to leave structures on the insulating layer.

The spacers 42 and 44 are subsequently removed, as illustrated in FIG. 9. An etchant is used that selectively removes the material of the spacers 42 and 44 over the materials of the other components illustrated in FIG. 9. The structures 47 and 48 are now exposed. Each structure 47 or 48 has a very narrow and well-defined width 24, a very narrow and well-defined length 50, and a very narrow and well-defined height 18. What should also be noted is that both structures 47 and 48 are simultaneously formed and are lengthwise spaced from one another. More structures can be formed that are spaced across the width of the insulating layer 12. The structures may be formed in rows and columns, for example in an exact rectangular matrix that includes hundreds or thousands of structures.

Figure 10:
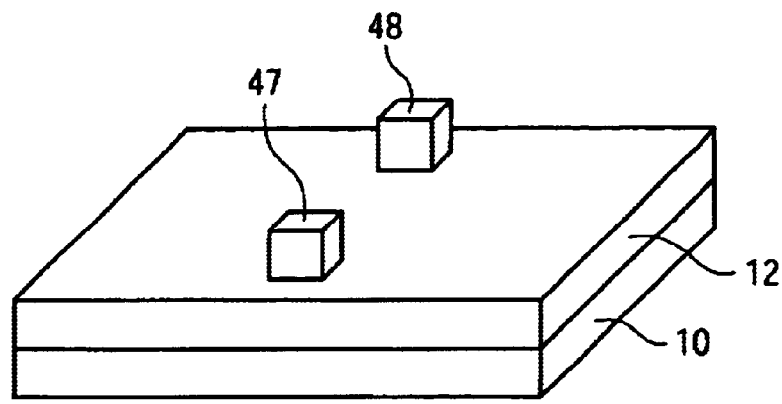
FIG. 10 is a view similar to FIG. 9 after the width-defining step is removed, according to one embodiment of the invention.

The width-defining step 14 may then be removed, as illustrated in FIG. 10, utilizing an etchant that selectively removes the material of the width-defining step 14 over the materials of the structures 47 and 48 and of the insulating layer 12. The structures 47 and 48 then stand proud of the insulating layer 12 and may, for example, be used as a nucleation site for purposes of growing a nanowire or acting as a quantum dot structure.

Figure 11:
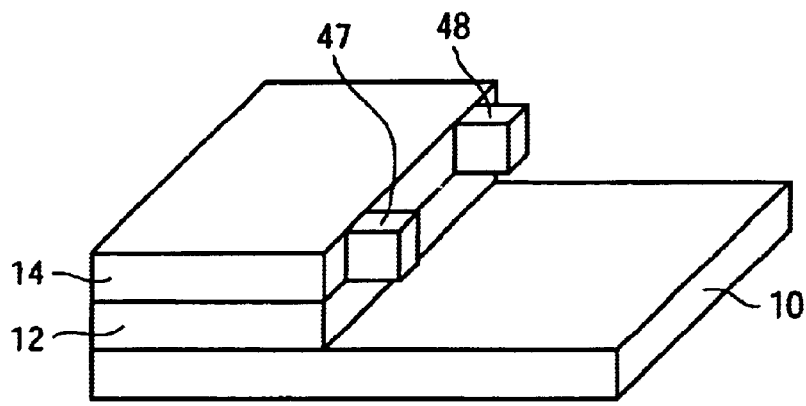
FIG. 11 is a view similar to FIG. 9, after a portion of the insulating layer is removed so that the structures are suspended above the substrate.

Alternatively, as illustrated in FIG. 11, the width-defining step 14 may be used as a mask to etch away exposed portions of the insulating layer 12. The structures 47 and 48 are then suspended above the substrate 10 by a distance corresponding to a thickness of the insulating layer 12. The structures 47 and 48 have side surfaces that are attached to the width-defining step 14.

Figure 12:
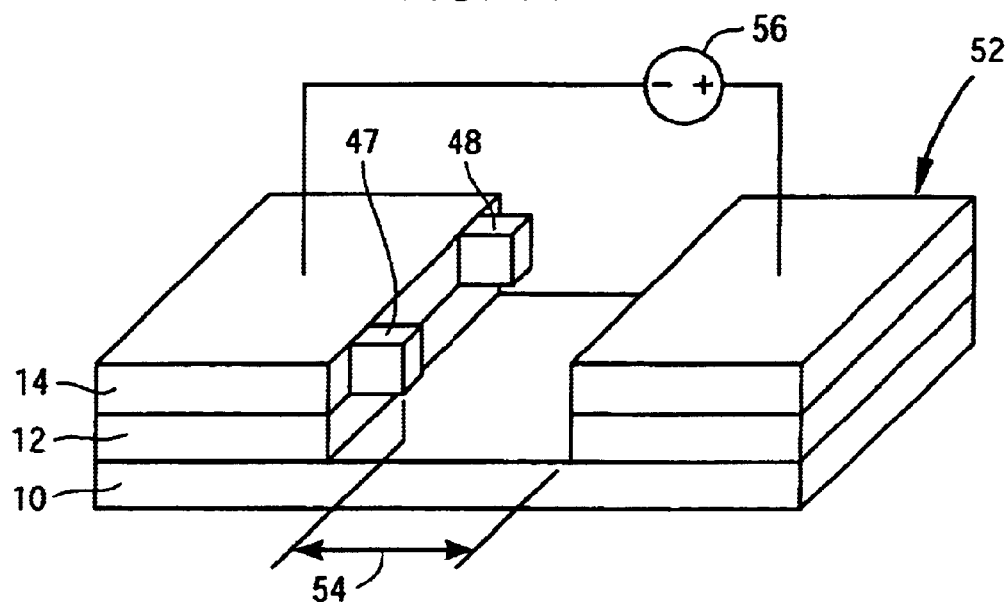
FIG. 12 is a view similar to FIG. 11, illustrating the formation of another component on the substrate and application of a bias voltage, for example to control the direction of growth of nanowires from the structures.

As illustrated in FIG. 12, another component 52 may be formed on a side of the structures 47 and 48 opposing the width-defining step 14, with a gap 54 defined between the structures 47 and 48 and the component 52. A voltage source 56 may be connected over the component 52 and the width-defining step 14, so that a voltage bias is applied over the structures 47 and 48 and the component 52. The voltage bias can be used to control a direction in which a nanowire grows from exposed side surfaces of the structures 47 and 48.

In the embodiment described, the width-defining layer 20 serves the dual purpose of forming a spacer for purposes of defining the width 24 and for forming the eventual structures 47 and 48, whereas the length-defining layer 40 serves the single purpose of defining the lengths of the structures 47 and 48. In another embodiment, a width-defining layer may be used to form a spacer which serves the sole purpose of defining a width for purposes of forming another structure, and a length-defining layer may serve the dual purpose of forming a spacer that defines a length of the structure and from which the structure is formed. It may also be possible to first form a length-defining layer, whereafter the width-defining layer is formed. As a further possibility, length- and width-defining layers may be formed and used for defining widths and lengths of areas across a substrate without necessarily forming structures on and having dimensions corresponding to the areas.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of forming a sub-micron-size structure over a substrate, comprising:

forming a width-defining step over the substrate;

forming a width-defining layer over an edge of the width-defining step;

etching the width-defining layer back to leave a spacer adjacent the width-defining step;

forming a length-defining step over the substrate;

forming a length-defining layer over an edge of the length-defining step;

etching the length-defining layer back to leave a spacer adjacent a first edge of the length-defining step and across a first portion of the spacer left by the width-defining layer;

removing the length-defining step; and etching the spacer left by the width-defining layer with the spacer left by the length-defining layer serving as a mask, to form the structure.

2. The method of claim 1, wherein etching of the length-defining layer leaves a spacer adjacent a second edge of the length-defining step and across a second portion of the spacer left by the width-defining layer.

3. The method of claim 2, wherein the length-defining step is simultaneously removed from adjacent both spacers left by the length-defining step.

4. The method of claim 1, further comprising:
removing the width-defining step.

5. The method of claim 1, further comprising:
removing at least a portion of a layer below the structure.

6. The method of claim 5, wherein the structure is attached to the width-defining step after the layer below the structure is removed.

7. The method of claim 6, further comprising:
forming a bias step with a space defined between the structure and the bias step; and
applying a voltage over the width-defining step and the bias step.

8. A method, comprising:
forming a width-defining step over the substrate, having a longitudinal edge extending lengthwise over the substrate;
forming a width-defining layer over the width-defining step, down the longitudinal edge thereof and over the substrate;
etching the width-defining layer back to leave a sub-micron-size spacer adjacent the width-defining step, the spacer extending along the longitudinal edge, and having a first width-defining edge adjacent the step, and a second, opposing width-defining edge distant from the longitudinal edge, a sub-micron-size width of an area being defined between the first and second width-defining edges;
forming a length-defining step over the substrate, having a transverse edge extending across the width over the substrate;
forming a length-defining layer over the length-defining step, down the transverse edge thereof and over the substrate; and
etching the length-defining layer back to leave a spacer adjacent the length-defining step, the spacer extending along the transverse edge, and having a first length-defining edge adjacent the step, and a second, opposing length-defining edge distant from the longitudinal edge, a sub-micron-size length of the area being defined between the first and second length-defining edges.

9. The method of claim 8, wherein a structure is formed over the area, the structure having dimensions defined by the width and the length of the area.

10. The method of claim 9, wherein one of the spacers is formed into the structure.

11. The method of claim 10, wherein the first spacer is formed into the structure.

12. The method of claim 11, further comprising:
etching the first spacer with the second spacer serving as a mask to define a length of the first spacer.

13. A method of forming a sub-micron-size structure over a substrate, comprising:
forming a width-defining step over the substrate, having a longitudinal edge extending lengthwise over the substrate;
forming a width-defining layer over the width-defining step, down the longitudinal edge thereof and over the substrate;
etching the width-defining layer back to leave a sub-micron-size spacer adjacent the width-defining step, the spacer extending along the longitudinal edge, and having a first width-defining edge adjacent the step, and a second, opposing width-defining edge distant from the longitudinal edge;
forming a length-defining step over the substrate, having a transverse edge extending across the spacer left by the width-defining layer;
forming a length-defining layer over the length-defining step, down the transverse edge thereof and over the substrate;
etching the length-defining layer back to leave a spacer adjacent the length-defining step and across the spacer left by the width-defining layer, the spacer extending along the transverse edge, and having a first length-defining edge adjacent the step, and a second, opposing length-defining edge distant from the longitudinal edge; and
etching the spacer left by the width-defining layer with the spacer left by the length-defining layer serving as a mask, to form the structure.

14. The method of claim 13, wherein the length-defining step is simultaneously removed from adjacent both spacers left by the length-defining step.

15. The method of claim 14, wherein the structure is attached to the width-defining step after the layer below the structure is removed.

16. The method of claim 15, further comprising:
forming a bias step with a space defined between the structure and the bias step; and
applying a voltage over the width-defining step and the bias step.

* * * * *